(12) United States Patent
Takahashi et al.

(10) Patent No.: US 7,790,644 B2
(45) Date of Patent: Sep. 7, 2010

(54) ZINC-OXIDE-BASED TARGET

(75) Inventors: Seiichiro Takahashi, Ageo (JP); Seiji Moriuchi, Ageo (JP); Norihiko Miyashita, Ageo (JP); Makoto Ikeda, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 12/561,715

(22) Filed: Sep. 17, 2009

(65) Prior Publication Data

US 2010/0065424 A1 Mar. 18, 2010

(30) Foreign Application Priority Data

Sep. 17, 2008 (JP) ............................... 2008-238751

(51) Int. Cl.
*C04B 35/453* (2006.01)
*C23C 14/34* (2006.01)

(52) U.S. Cl. ............. 501/134; 204/298.13; 252/519.51; 252/520.2

(58) Field of Classification Search ................. 501/134; 252/519.51, 520.2; 204/298.13
See application file for complete search history.

(56) References Cited

U.S. PATENT DOCUMENTS 5,236,632 A * 8/1993 Ogawa et al. ............ 252/519.5
6,528,442 B1 * 3/2003 Kuwano et al. ............... 501/41
2009/0206303 A1 * 8/2009 Osada .................... 252/519.51
2009/0250669 A1 * 10/2009 Osada .................... 252/519.51

FOREIGN PATENT DOCUMENTS

| JP | 62-154411 A | 7/1987 |
|---|---|---|
| JP | 8-264022 A | 10/1996 |
| JP | 09-045140 A | 2/1997 |
| JP | 10-306367 A | 11/1998 |
| JP | 11-256320 * | 9/1999 |
| JP | 11-256320 A | 9/1999 |
| JP | 11-286002 A | 10/1999 |
| JP | 11-322332 * | 11/1999 |
| JP | 11-322413 A | 11/1999 |
| JP | 2000-119062 A | 4/2000 |
| JP | 2000-195101 A | 7/2000 |
| JP | 2002-075061 A | 3/2002 |
| JP | 2002-075062 A | 3/2002 |

OTHER PUBLICATIONS

Machine translation, Japanese document 10-306367, Nov. 1998.*

* cited by examiner

*Primary Examiner*—Karl E Group
(74) *Attorney, Agent, or Firm*—Sughrue Mion, PLLC

(57) ABSTRACT

The invention provides a zinc-oxide-based target, having excellent environmental durability. The target contains zinc oxide as a predominant component, and both titanium (Ti) and gallium (Ga) in amounts of 1.1 at. % or more and 4.5 at. % or more, respectively.

1 Claim, 5 Drawing Sheets

ZINC-OXIDE-BASED TARGET

The entire disclosure of Japanese Patent Application No. 2008-238751 filed Sep. 17, 2008 is expressly incorporated by reference herein.

BACKGROUND OF THE INVENTION

1. Field of the Invention

The present invention relates to a zinc-oxide-based target containing zinc oxide as a predominant component.

2. Background Art

Transparent conductive film finds a wide range of applications, including IR-shielding sheet, electrostatic shielding sheet, electroconductive film (sheet heater, touch switch, etc.), and transparent electrodes employed in a display device or a similar device, and demand for such transparent conductive film has increased. Conventionally, such transparent conductive film has been made of tin-doped indium oxide (ITO) film, which is an expensive material. Therefore, there is keen demand for inexpensive transparent conductive film.

Under such circumstances, zinc-oxide-based transparent conductive film, which is less expensive than ITO film, has become attractive. Currently, aluminum-doped zinc oxide (AZO), gallium-doped zinc oxide (GZO), etc. are available on the market.

Since zinc-oxide-based transparent conductive film is inferior to ITO in conductivity and stability, a variety of elements are added to zinc oxide in order to improve conductivity and stability (see Japanese Patent Application Laid-Open (kokai) Nos. 62-154411, 9-45140, 2002-75061, 2002-75062, etc. (Claims)). Among such additional elements, addition of Ga has been extensively studied (see Japanese Patent Application Laid-Open (kokai) Nos. 10-306367, 11-256320, 11-322332, etc. (Claims)).

However, zinc-oxide-based transparent conductive film has excessively high etching rate, making patterning of the film difficult, and is unsatisfactory in terms of environmental durability. These problems impede practical use of zinc-oxide-based transparent conductive film.

SUMMARY OF THE INVENTION

In view of the foregoing, an object of the present invention is to provide a zinc-oxide-based target which realizes formation of zinc-oxide-based transparent conductive film having excellent environmental durability.

In a first mode of the present invention for attaining the object, there is provided a zinc-oxide-based target having an oxide sintered body, the oxide comprising zinc oxide as a predominant component and both titanium (Ti) and gallium (Ga) in amounts of 1.1 at. % or more and 4.5 at. % or more, respectively.

According to the first mode, by virtue of the presence of both titanium (Ti) and gallium (Ga) in amounts falling within predetermined ranges, there can be provided a zinc-oxide-based target, which can form a film having excellent environmental durability.

A second mode of the present invention is drawn to a specific embodiment of the zinc-oxide-based target according to the first mode, wherein a titanium content x (at. %) and a gallium content y (at. %) thereof satisfy the following conditions:

the gallium content (y) (at. %) is equal to or less than $(-2x+10.4)$; and the gallium content (y) (at. %) is equal to or greater than $(-0.5x+1.1)$.

According to the zinc-oxide-based target of the second mode, through controlling the amounts of titanium (Ti) and gallium (Ga) to fall within predetermined ranges, there can be provided a zinc-oxide-based target, which can form a zinc-oxide-based transparent conductive film having more reduced resistivity and more excellent electrical conductivity.

A third mode of the present invention is drawn to a specific embodiment of the zinc-oxide-based target according to the first or second mode, wherein a titanium content x (at. %) and a gallium content y (at. %) thereof satisfy the following conditions:

the gallium content (y) (at. %) is equal to or less than $(-x+3.4)$ or equal to or less than $(x-0.9)$; or equal to or greater than $(-2.3x+10.1)$.

According to the zinc-oxide-based target of the third mode, the carrier density of the formed film can be considerably reduced by controlling the titanium content and the gallium content to fall within specific ranges. By virtue of such a low carrier density, the optical transmittance of the film with respect to light having a long wavelength falling within the near-infrared region. Thus, a zinc-oxide-based target for forming a transparent conductive film particularly suitable for use in solar cells can be provided.

Since the zinc-oxide-based target of the present invention contains both titanium (Ti) and gallium (Ga) in amounts falling within specific ranges, a transparent conductive film having excellent environmental durability can be advantageously formed.

DETAILED DESCRIPTION OF PREFERRED EMBODIMENTS

Figure 1A:
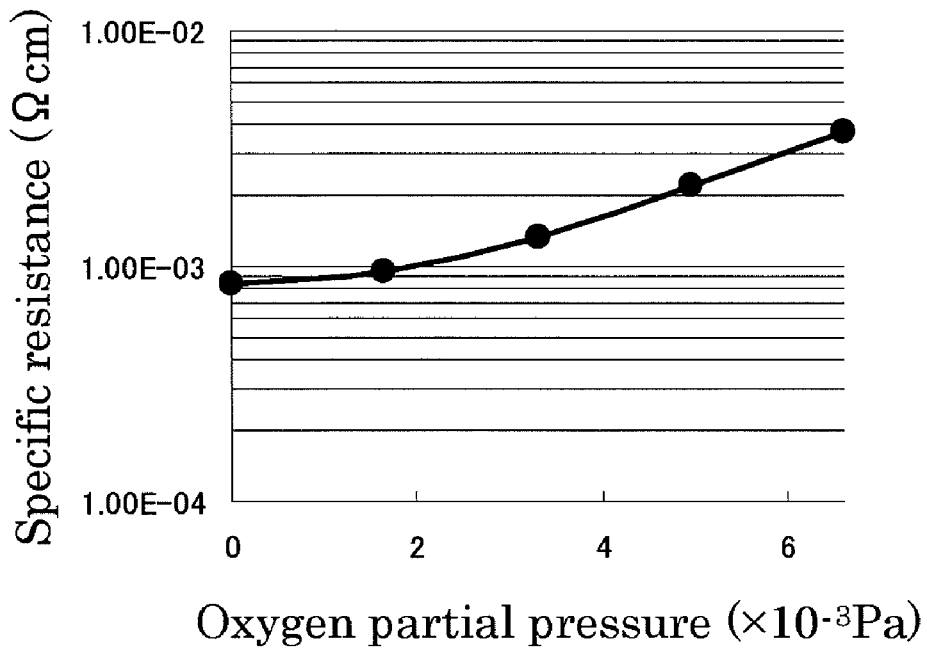
FIG. 1A is a graph showing the dependency of resistivity of a film falling within the scope of the invention on oxygen partial pressure during film formation.

The zinc-oxide-based target of the present invention has been accomplished on the basis of the finding that zinc-oxide-based transparent conductive film having remarkably improved environmental durability can be formed from a sintered target predominantly containing zinc oxide, and both gallium and titanium as additives.

The zinc-oxide-based target of the present invention is formed of a sintered oxide containing both titanium (Ti) and gallium (Ga) as additive elements. The titanium content is 1.1 at. % or more, and the gallium content is 4.5 at. % or more. That is, the present invention excludes a titanium content less than 1.1 at. % and a gallium content less than 4.5 at. %. When the target contains Ti and Ga in amounts falling within the above ranges, a transparent conductive film having enhanced environmental durability can be formed. This remarkably advantageous effect cannot be obtained when the Ti content or the Ga content falls outside the above ranges.

As used herein, the term "zinc-oxide-based target" refers to a target formed of a zinc-oxide-based sintered body and is used for forming transparent conductive film through sputtering. In addition to the sputtering target, the target of the invention also encompasses an ion-plating target (also called pellet) for forming transparent conductive film through ion plating.

According to the present invention, as mentioned hereinbelow, there can be produced a target which can form a transparent conductive film exhibiting a percent change in resistivity as small as 7% or less, as determined by an environmental durability test. Such environmental durability ensures durability of the film in practical use.

In the present invention, the metal element content (at. %) is represented by the ratio of the amount by mole of the metal element of interest to the total amount by mole of the all metallic elements (i.e., Ti/(Zn+Ti+Ga), Ga/(Zn+Ti+Ga)).

In the environmental durability test performed in the invention, the resistivity of a tested film is measured before and after the film is allowed to stand for 250 hours at 60° C. and a relative humidity of 90%, and the difference therebetween is determined. When the change in resistivity (i.e., increase) of a tested film is 7% or less, the film is considered to be durable in practical use and to cause no fatal problem in device design.

The percent change in resistivity (%) is defined by the following relationship:

Percent change in resistivity (%)=[(resistivity after environmental durability test/resistivity before environmental durability test)−1]×100.

In some cases, resistivity decreases, but such a decrease is not problematic for designing related devices. In the present invention, such cases are regarded to satisfy the condition of a change in resistivity of 7% or less.

The target of the invention preferably satisfies the following conditions: the gallium content (y) (at. %) is equal to or less than (−2x+10.4); and the gallium content (y) (at. %) is equal to or greater than (−0.5x+1.1).

Particularly when the target of the invention satisfies the following conditions: the gallium content (y) (at. %) is equal to or less than (−2.5x+9.8); and the gallium content (y) (at. %) is equal to or greater than (−0.5x+1.1), a more excellent film having a resistivity of $1.5\times10^{-3}$ Ωcm or less can be formed.

Through incorporation, into the zinc oxide target, of gallium and titanium in amounts satisfying the above conditions, the resistivity of the formed film can be reduced to $2.5\times10^{-3}$ Ωcm or less, or $1.5\times10^{-3}$ Ωcm or less, whereby a film having an improved electroconductivity can be formed.

A resistivity of $2.5\times10^{-3}$ Ωcm or less, or $1.5\times10^{-3}$ Ωcm or less is preferred from a practical viewpoint, since a transparent conductive film having a resistivity about $1\times10^{-3}$ Ωcm is considered to be employable as, for example, an array-side electrode of a liquid crystal display.

Furthermore, particularly preferably, the target of the invention satisfies the following conditions: the gallium content (y) (at. %) is equal to or less than (−x+3.4) or equal to or less than (x−0.9); or equal to or greater than (−2.3x+10.1).

Through incorporation, into zinc oxide, of gallium and titanium in amounts satisfying the above conditions, the formed film has a reduced carrier density and, therefore, facilitates transmission of light having a long wavelength falling within the near-infrared region. Thus, the target can provide a transparent conductive film suitable for use in, for example, solar cells.

When the amounts of gallium and titanium are adjusted to fall within the aforementioned preferred ranges, the carrier density is reduced to $4.0\times10^{20}$ cm$^{-3}$ or less, which is suitable for use in solar cells.

The transmittance of light having a long wavelength falling within the near-infrared region increases when plasma vibration of free electrons, which determines whether the film absorbs or reflects light, occurs at a longer wavelength. The plasma wavelength, at which plasma oscillation occurs, is represented by the following equation:

$$\lambda_p = \frac{2\pi c}{\sqrt{\frac{4\pi n_e^2}{\varepsilon_0 \varepsilon m^*} - \left(\frac{e}{300\ \mu m^*}\right)^2}}$$

(wherein c represents light velocity ($3.0\times10^{10}$ [cm/s], e represents charge of electron ($4.8\times10^{-10}$ esu), $n_e$ represents a carrier density [cm$^{-3}$], $\epsilon_0$ is π/4, ε represents a permittivity (=the square of diffractive index; i.e., $n^2=2.0^2=4.0$), m* represents an effective mass of electron of zinc oxide ($0.28\times9.1\times10^{-28}$ [g], and μ represents a mobility [cm$^2$/V·s]). The smaller the carrier density, the longer the plasma wavelength.

When the carrier density is $4\times10^{20}$ cm$^{-3}$, the plasma wavelength is about 1,650 nm. In this case, light having a long wavelength can satisfactorily transmit the formed film.

Next, the method of producing the zinc-oxide-based target according to the present invention will be described. However, the production method is not limited to the following exemplified procedure.

Generally, the starting materials for forming the target of the present invention are zinc oxide (ZnO), gallium oxide (Ga$_2$O$_3$), and titanium oxide (TiO$_2$) in the powder form. The staring materials may also be in the form of element, compound, compound oxide, etc. The element or compound form materials are subjected to an oxidation process before use thereof.

No particular limitation is imposed on the methods of mixing the raw material powders in desired proportions and of compacting the mixture. The resultant mixture is compacted through any of conventionally wet methods and dry methods.

Examples of the dry method include the cold press method and the hot press method. The cold press method includes charging a powder mixture into a mold to form a compact and firing the compact. The hot press method includes firing a powder mixture placed in a mold for sintering.

Examples of preferred wet methods include a filtration molding method (see Japanese Patent Application Laid-Open (kokai) No. 11-286002). The filtration molding method employs a filtration mold, formed of a water-insoluble material, for removing water under reduced pressure from a ceramic raw material slurry, to thereby yield a compact, the filtration mold comprising a lower mold having one or more water-discharge holes; a water-passing filter for placement on the lower mold; a seal material for sealing the filter; and a mold frame for securing the filter from the upper side through intervention of the seal material. The lower mold, mold frame, seal material, and filter, which can be separated from one another, are assembled to thereby form the filtration mold. According to the filtration molding method, water is removed under reduced pressure from the slurry only from the filter side. In a specific operation making use of the filtration mold, a powder mixture, ion-exchange water, and an organic additive are mixed, to thereby prepare a slurry, and the slurry is poured into the filtration mold. Water contained in the slurry is removed under reduced pressure from only the filter side, a compact is yielded. The resultant ceramic compact is dried, debindered, and fired.

The firing temperature at which the compact produced through the cold press method or the wet method is preferably 1,000 to 1,500° C., more preferably 1,000 to 1,300° C. The firing atmosphere is air, oxygen, a non-oxidizing atmosphere, vacuum, etc. In the case where hot-press method is employed, the compact is preferably sintered at 900 to 1,300° C., and the atmosphere is a non-oxidizing atmosphere, vacuum, etc. In each method, after firing, the fired compact is mechanically worked so as to form a target having predetermined dimensions.

EXAMPLES

The present invention will next be described by way of examples (sputtering targets), which should not be construed as limiting the invention thereto.

Sputtering Target Production Examples 1 to 50

ZnO powder (BET=3.59 m$^2$/g), TiO$_2$ powder (BET=7.10 m$^2$/g), and Ga$_2$O$_3$ (BET=13.45 m$^2$/g) were mixed at such proportions that the Ti content (Ti/(Zn+Ti+Ga) by mole) (at. %) and the Ga content (Ga/(Zn+Ti+Ga) by mole) (at. %) were adjusted to the values shown in Tables 1 and 2 (Samples A1 to A50). In each case, the total amount of the mixture was adjusted to about 1.0 kg, and the mixture was milled by means of a ball mill. Subsequently, the obtained powder was mixed with 6.6 wt. % of 4 wt. % aqueous polyvinyl alcohol solution serving as a binder, followed by kneading and cold-pressing, to thereby prepare a compact.

The compact was heated in air at 60° C./h to 600° C. and debindered at 600° C. for 10 hours. The debindered compact was heated in air at room temperature to 1,300° C. at 100° C./h; fired at 1,300° C. for eight hours; and cooled to room temperature at 100° C./h, to thereby form a sintered compact. The thus-produced sintered compact was surface-ground, to thereby produce a target (φ100 mm×6 mmt).

Through ICP analysis, the produced sintered target was found to have virtually the same metallic compositional proportions as those of the corresponding starting material.

AZO Sputtering Target Production Example

ZnO powder (BET=3.59 m$^2$/g) and Al$_2$O$_3$ (BET=3.89 m$^2$/g) were mixed at such proportions that the Al content (Al/(Zn+Al) by mole) (at. %) was adjusted to 2.4 at. %. The total amount of the mixture was adjusted to about 1.0 kg, and the mixture was milled by means of a ball mill. Subsequently, the obtained powder was mixed with 6.6 wt. % of 4 wt. % aqueous polyvinyl alcohol solution serving as a binder, followed by kneading and cold-pressing, to thereby prepare a compact.

The compact was heated in air at 60° C./h to 600° C. and debindered at 600° C. for 10 hours. The debindered compact was heated in air at room temperature to 1,300° C. at 100° C./h; fired at 1,300° C. for eight hours; and cooled to room temperature at 100° C./h, to thereby form a sintered compact. The thus-produced sintered compact was surface-ground, to thereby produce a target (φ100 mm×6 mmt).

Film Formation Example

Each of the sputtering target produced in the Production Examples and the AZO sputtering target was placed in a 4-inch-cathode DC magnetron sputtering apparatus. A transparent conductive film was formed from the sputtering target at a substrate temperature of 250° C. while the oxygen partial pressure was varied from 0 to 2.0 sccm by 0.5 sccm (corresponding to 0 to 6.6×10$^{-3}$ Pa).

The thus-produced transparent conductive film was identified to a zinc-oxide-based transparent conductive film having the same compositional proportions as those of the sputtering target from which the transparent conductive film was formed. The compositional analysis of the zinc-oxide-based transparent conductive film may be performed by dissolving the entirety of the film and subjecting the solution to ICP. When the film is a member included in a device, alternatively, a cross-section of the film may be developed through FIB or similar means in accordance with needs, and the cross-section was analyzed by means of an element analyzer (e.g., EDS, WDS, or Auger analyzer) attached to an SEM, a TEM, etc.

Each target was subjected to sputtering under the following conditions, whereby an oxide film having a thickness of 1,200 Å was formed.

Sputtering Conditions:

Target dimensions: φ=100 mm, t=6 mm

Mode of sputtering: DC magnetron sputtering

Evacuation apparatus: Rotary pump+cryo-pump

Vacuum attained: ≦3×10$^{-5}$ Pa

Ar pressure: 4.0×10$^{-1}$ Pa

Oxygen pressure: 0 to 6.6×10$^{-3}$ Pa

Substrate temperature: 250° C.

Input power for sputtering: 130 W (power density: 1.6 W/cm$^2$)

Substrate used: Corning #1737 (glass substrate for liquid crystal display), 50 mm×50 mm×0.8 mmt Transparent conductive films were formed from each target at varied oxygen partial pressures, and pieces (10 mm×10 mm) were cut from each film. The resistivity of each cut piece was determined through the Van der Pauw method by means of a Hall coefficient measuring device (ResiTest 8300, product of Toyo Corporation).

Figure 1B:
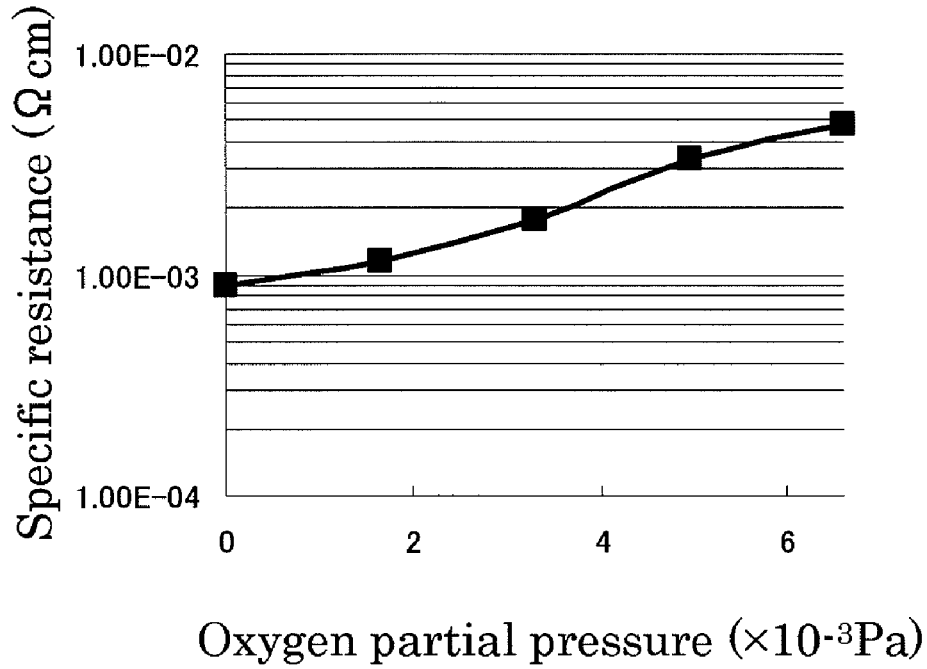
FIG. 1B is a graph showing the dependency of resistivity of a comparative film on oxygen partial pressure during film formation.

FIG. 1B is a graph showing the dependency of resistivity of 2.4 at. % aluminum (Al)-doped ZnO (AZO) film (Comparative Example) on oxygen partial pressure. As shown in the graph, the resistivity is the lowest at an oxygen partial pressure of 0. FIG. 1A is a graph showing the dependency of resistivity of 2 at. % Ti- and 1 at. % Ga-doped ZnO film (Sample A24) on oxygen partial pressure. As is clear from FIG. 1A, Sample A24 shows an oxygen partial pressure dependency of resistivity that is similar to that of AZO film. All TiGa-doped ZnO films having other compositional proportions (other samples) also exhibit the same dependency. Thus, all the data shown in Tables 1 and 2 were determined at an oxygen partial pressure of 0.

Test Example 1

Environmental Durability Test

Transparent conductive films were formed from corresponding targets at an oxygen partial pressure of 0, and pieces (10 mm×10 mm) were cut from each film. The resistivity of each cut piece was determined through the Van der Pauw method by means of a Hall coefficient measuring device (ResiTest 8300, product of Toyo Corporation). Thereafter, the film piece was placed in a thermo- and humidity-stat vessel (PR-2 KP, product of ESPEC), and the vessel was sealed. The piece was allowed to stand for 250 hours in an atmosphere at 60° C. and 90% RH, and the resistivity was measured again. The percent change in resistivity was calculated from the resistivity values before and after storage in the above conditions. Notably, when the temperature in the thermo- and humidity-stat vessel was elevated or lowered, the inside temperature and humidity were appropriately controlled so as to prevent wetting of the sample which would otherwise be caused by dew condensation.

Tables 1 and 2 show the results.

As shown in Tables 1 and 2, Samples A1 to A10, having a titanium content less than 1.1 at. % and a gallium content less than 4.5 at. %, and Samples A16 and A22, having a gallium content of 0 at. %, exhibited a percent change in resistivity greater than 7%. However, the other samples exhibited a percent change in resistivity of 7% or less. As is clear from the data shown in Table 1, the percent change in resistivity is 7% or less when the titanium content is 1.2 at. % or more. Furthermore, from the data other than those given in Tables 1 and 2, the percent change in resistivity is 7% or less when the titatium content is 1.1 at. % or more and the gallium content is 4.5 at. % or more.

Figure 2:
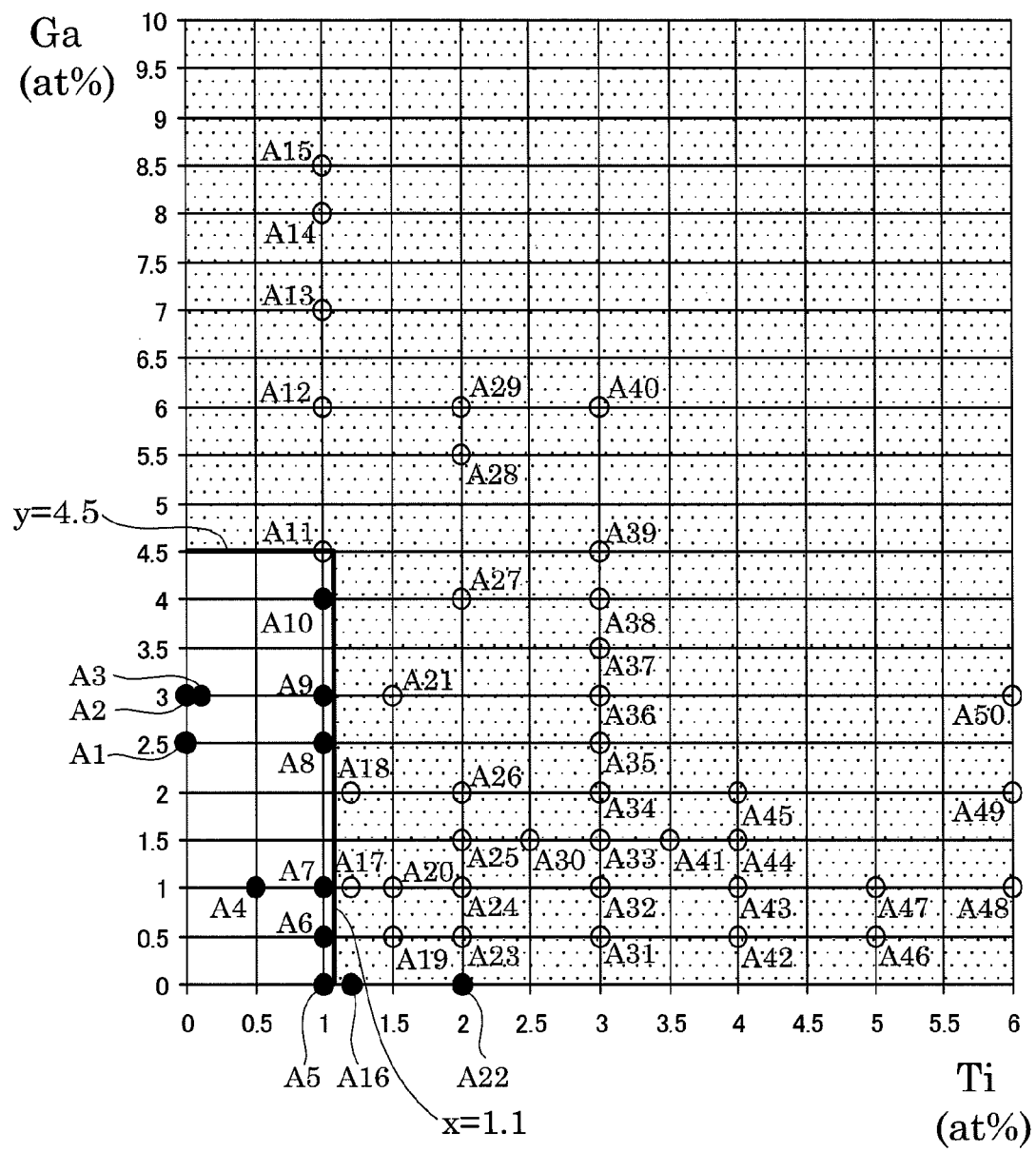
FIG. 2 is a graph showing the results of an environmental durability test.

In FIG. 2, samples which exhibited an environmental durability test result (percent change in resistivity) of 7% or less are represented by a "white circle," and samples which exhibited an environmental durability test result in excess of 7% are represented by a "black circle."

Test Example 2

Resistivity Measurement

Transparent conductive films were formed from corresponding targets at an oxygen partial pressure of 0, and pieces (10 mm×10 mm) were cut from each film. The resistivity of each cut piece was determined through the Van der Pauw method by means of a Hall coefficient measuring device (ResiTest 8300, product of Toyo Corporation).

Tables 1 and 2 show the results.

As shown in Tables 1 and 2, when the samples have a gallium content (y) (at. %) equal to or less than $(-2x+10.4)$ and equal to or greater than $(-0.5x+1.1)$, the resistivity thereof is $2.5 \times 10^{-3}$ Ωcm or less. In contrast, samples having compositional relationship falling outside the above ranges exhibit a resistivity higher than $2.5 \times 10^{-3}$ Ωcm. Furthermore, judging generally from the data other than those given in Tables 1 and 2, when the gallium content (y) (at. %) is equal to or less than $(-2x+10.4)$ (threshold) and equal to or greater than $(-0.5x+1.1)$ (threshold), the resistivity thereof is $2.5 \times 10^{-3}$ Ωcm or less.

Figure 3:
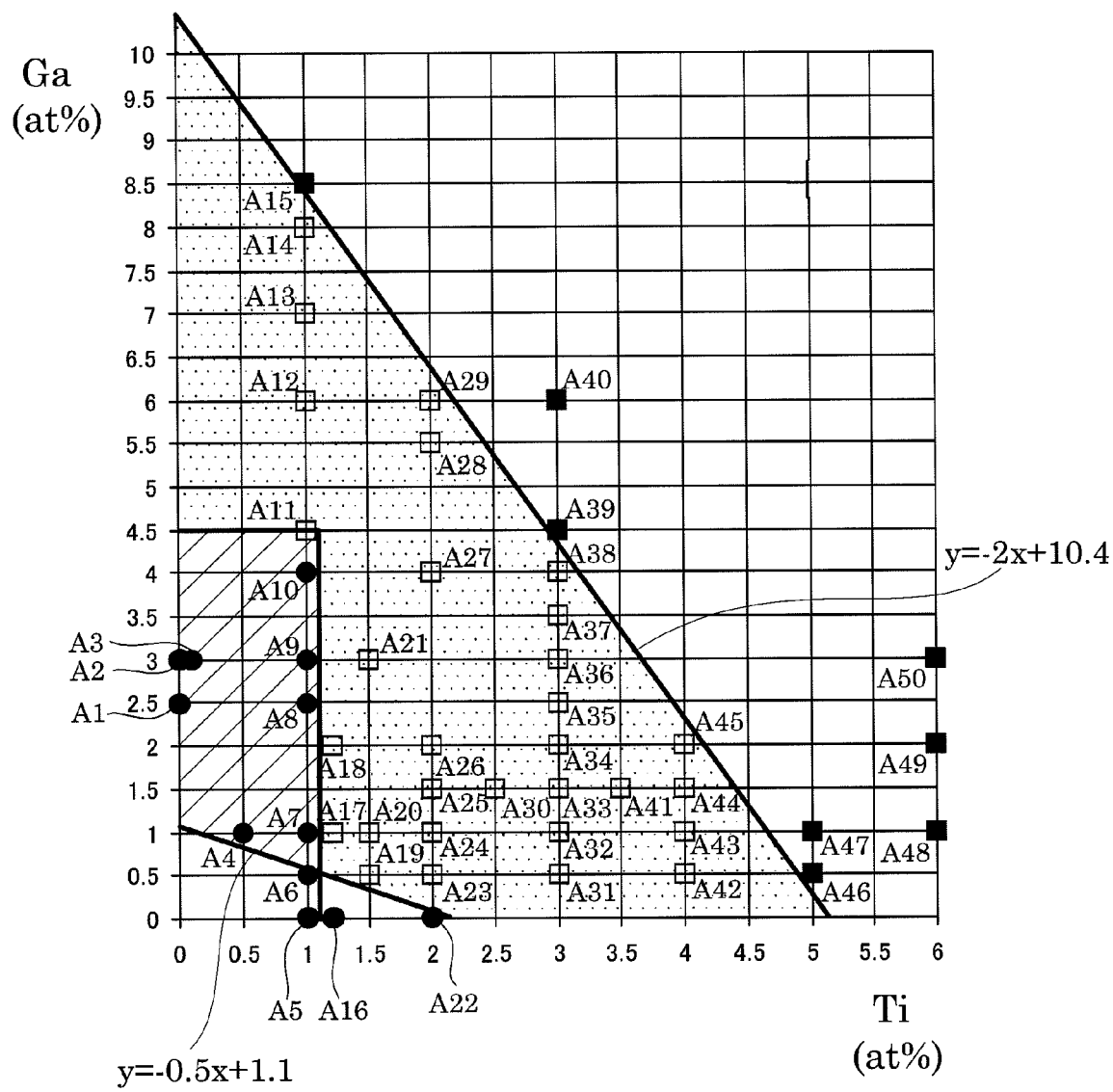
FIG. 3 is a graph showing the results of an environmental durability test and resistivity measurements.

In FIG. 3, samples which exhibited an environmental durability test result (percent change in resistivity) of 7% or less and a resistivity of $2.5 \times 10^{-3}$ Ωcm or less are represented by a "white square," and samples which exhibited an environmental durability test result of 7% or less and a resistivity higher than $2.5 \times 10^{-3}$ Ωcm are represented by a "black square." Samples which exhibited an environmental durability test result in excess of 7% are represented by a "black circle."

In addition, when the samples have a gallium content (y) (at. %) equal to or less than $(-2.5x+9.8)$ and equal to or greater than $(-0.5x+1.1)$, the resistivity thereof is $1.5 \times 10^{-3}$ Ωcm or less. Furthermore, judging generally from the data other than those given in Tables 1 and 2, in the region of the graph of FIG. 3 defined by $y \leq 2x+10.4$, when the gallium content (y) (at. %) is equal to or less than $(-2.5x+9.8)$ (threshold) and equal to or greater than $(-0.5x+1.1)$ (threshold), the resistivity thereof is $1.5 \times 10^{-3}$ Ωcm or less.

Figure 4:
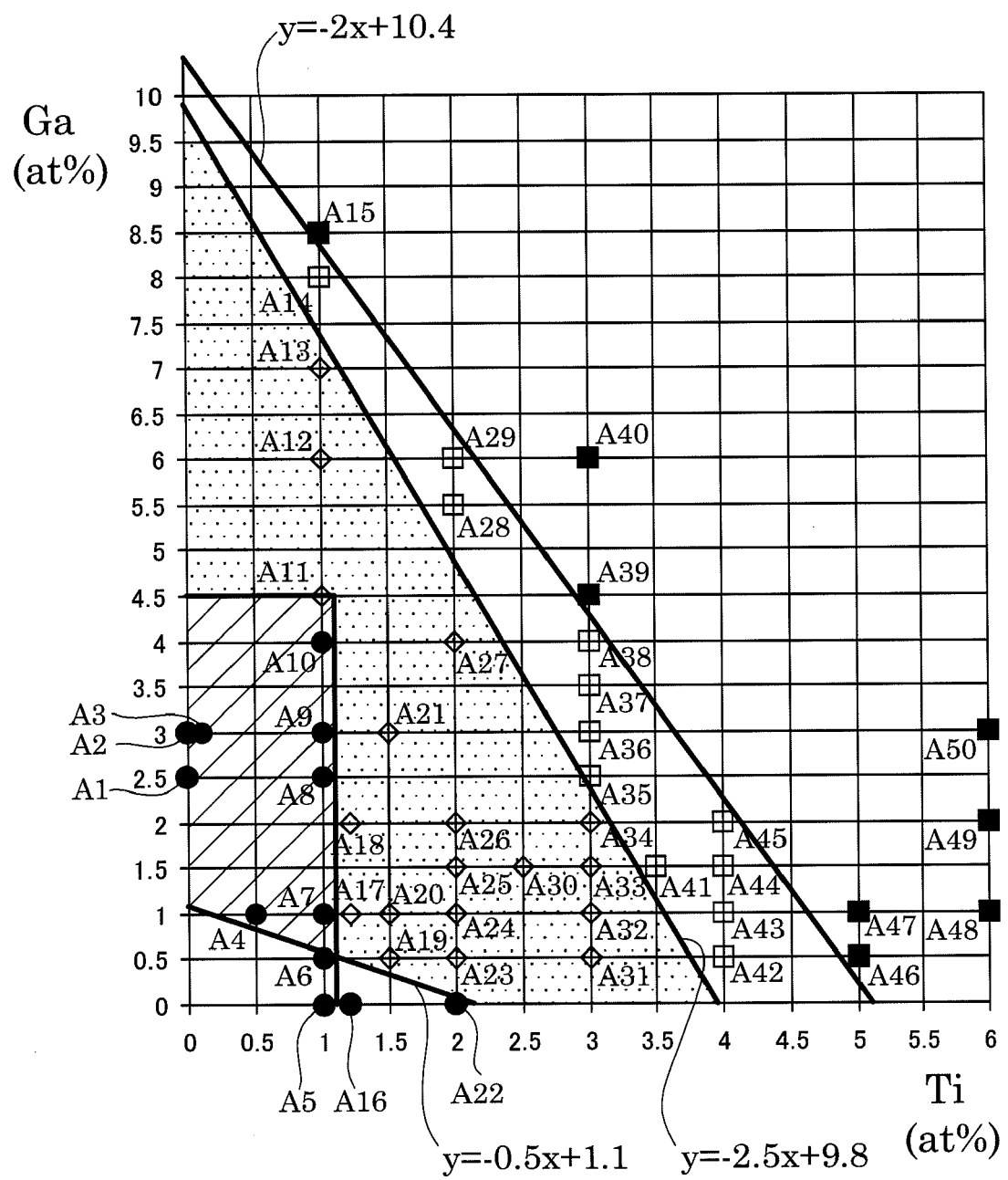
FIG. 4 is a graph showing the results of an environmental durability test and resistivity measurements.

In FIG. 4, samples which exhibited a resistivity thereof $1.5 \times 10^{-3}$ Ωcm or less are represented by a "white diamond."

Test Example 3

Hall Coefficient Measurement

Transparent conductive films were formed from corresponding targets at an oxygen partial pressure of 0, and pieces (10 mm×10 mm) were cut from each film. The carrier density and carrier mobility of each cut piece was determined through the Van der Pauw method by means of a Hall coefficient measuring device (ResiTest 8300, product of Toyo Corporation).

Tables 1 and 2 show the results.

As shown in Tables 1 and 2, when the samples have a gallium content (y) (at. %) equal to or less than $(-x+3.4)$ or equal to or less than $(x-0.9)$; or equal to or greater than $(-2.3x+10.1)$, the carrier density thereof is $4.0 \times 10^{20}$ cm$^{-3}$ or less. In contrast, samples having compositional relationship falling outside the above ranges exhibit a carrier density higher than $4.0 \times 10^{20}$ cm$^{-3}$. Furthermore, estimated generally from the data other than those given in Tables 1 and 2, when the gallium content (y) (at. %) is equal to or less than $(-x+3.4)$ or equal to or less than $(x-0.9)$; or equal to or greater than $(-2.3x+10.1)$, the carrier density thereof is $4.0 \times 10^{20}$ cm$^{-3}$ or less.

Figure 5:
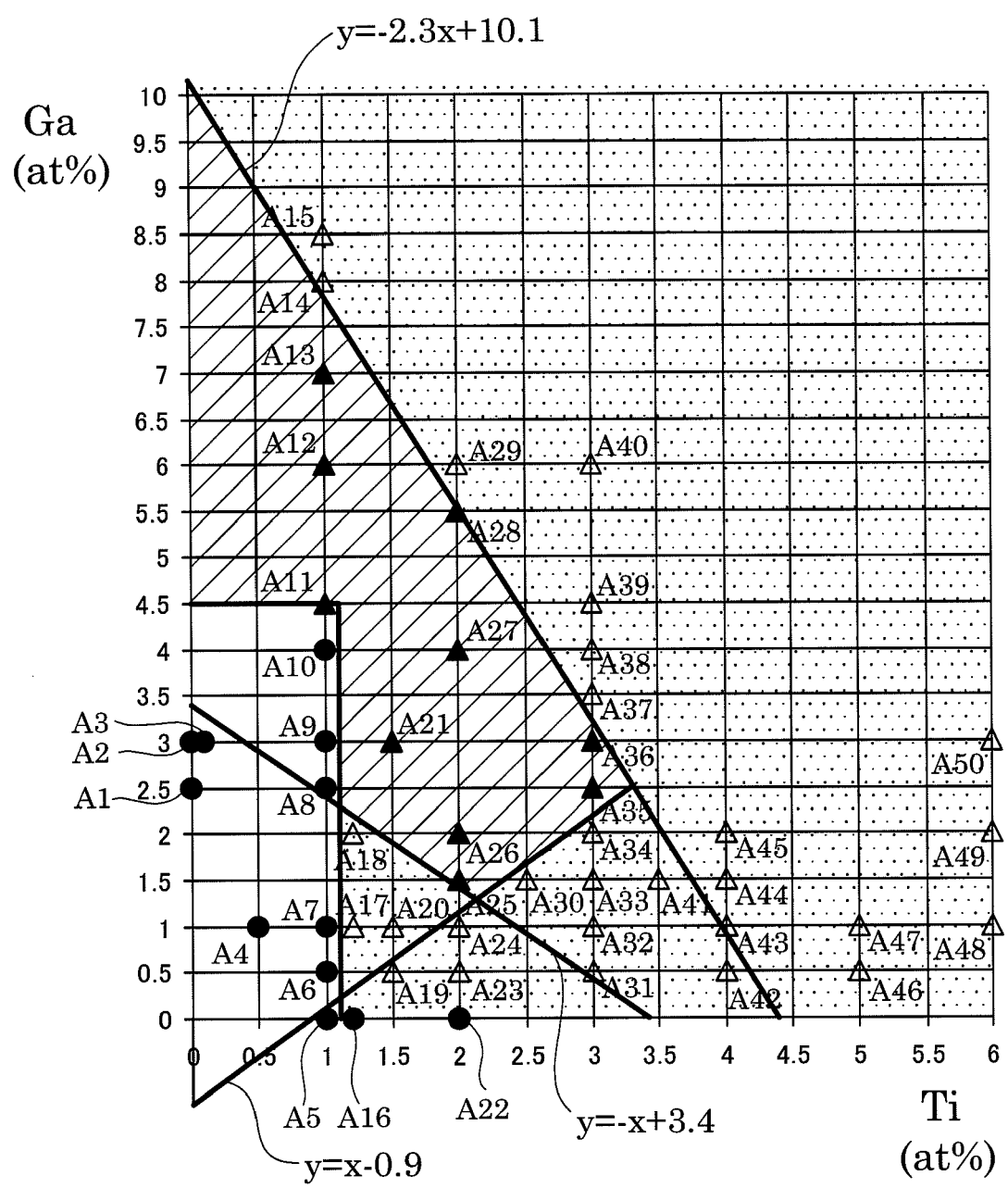
FIG. 5 is a graph showing the results of an environmental durability test and carrier density measurements.

In FIG. 5, samples which exhibited an environmental durability test result (percent change in resistivity) of 70 or less and a carrier density of $4.0 \times 10^{20}$ cm$^{-3}$ or less are represented by a "white triangle," and samples which exhibited an environmental durability test result of 7% or less and a carrier density higher than $4.0 \times 10^{20}$ cm$^{-3}$ are represented by a "black triangle." Samples which exhibited an environmental durability test result in excess of 7% are represented by a "black circle."

TABLE 1

| | Ti content (at. %) | Ga content (at. %) | Environmental durability test result (%) | Resistivity (Ωcm) | Carrier density (cm$^{-3}$) |
|---|---|---|---|---|---|
| A1 | 0 | 2.5 | 52.4 | 7.9E-04 | 4.8E+20 |
| A2 | 0 | 3 | 45.7 | 8.3E-04 | 4.1E+20 |
| A3 | 0.1 | 3 | 30 | 8.4E-04 | 4.1E+20 |
| A4 | 0.5 | 1 | 9.8 | 1.7E-03 | 2.0E+20 |
| A5 | 1 | 0 | 8.1 | 8.7E-03 | 7.9E+19 |
| A6 | 1 | 0.5 | 8.1 | 3.3E-03 | 1.3E+20 |
| A7 | 1 | 1 | 7.9 | 1.4E-03 | 2.4E+20 |
| A8 | 1 | 2.5 | 7.2 | 9.1E-04 | 4.2E+20 |
| A9 | 1 | 3 | 7.4 | 8.2E-04 | 4.9E+20 |
| A10 | 1 | 4 | 7.1 | 7.2E-04 | 6.3E+20 |
| A11 | 1 | 4.5 | 6.0 | 7.1E-04 | 6.5E+20 |
| A12 | 1 | 6 | 4.6 | 7.9E-04 | 6.8E+20 |
| A13 | 1 | 7 | 4.3 | 1.5E-03 | 4.3E+20 |
| A14 | 1 | 8 | 4.0 | 2.5E-03 | 3.0E+20 |
| A15 | 1 | 8.5 | 3.8 | 4.0E-03 | 2.0E+20 |
| A16 | 1.2 | 0 | 7.9 | 7.9E-03 | 8.0E+19 |
| A17 | 1.2 | 1 | 6.8 | 1.2E-03 | 3.0E+20 |
| A18 | 1.2 | 2 | 7.0 | 9.9E-04 | 3.7E+20 |
| A19 | 1.5 | 0.5 | 7.0 | 1.1E-03 | 2.5E+20 |
| A20 | 1.5 | 1 | 6.9 | 1.1E-03 | 3.0E+20 |
| A21 | 1.5 | 3 | 6.9 | 1.2E-03 | 4.2E+20 |
| A22 | 2 | 0 | 7.2 | 4.2E-03 | 1.2E+20 |
| A23 | 2 | 0.5 | 6.8 | 1.0E-03 | 2.8E+20 |
| A24 | 2 | 1 | 6.5 | 8.5E-04 | 3.8E+20 |
| A25 | 2 | 1.5 | 6.2 | 8.7E-04 | 4.2E+20 |
| A26 | 2 | 2 | 5.4 | 9.9E-04 | 4.6E+20 |
| A27 | 2 | 4 | 4.8 | 1.3E-03 | 5.3E+20 |

TABLE 1-continued

| | Ti content (at. %) | Ga content (at. %) | Environmental durability test result (%) | Resistivity ($\Omega$cm) | Carrier density ($cm^{-3}$) |
|---|---|---|---|---|---|
| A28 | 2 | 5.5 | 3.7 | 2.1E−03 | 4.2E+20 |
| A29 | 2 | 6 | 3.6 | 2.5E−03 | 3.9E+20 |
| A30 | 2.5 | 1.5 | 5.7 | 1.1E−03 | 4.0E+20 |

TABLE 2

| | Ti content (at. %) | Ga content (at. %) | Environmental durability test result (%) | Resistivity ($\Omega$cm) | Carrier density ($cm^{-3}$) |
|---|---|---|---|---|---|
| A31 | 3 | 0.5 | 5.7 | 1.3E−03 | 3.3E+20 |
| A32 | 3 | 1 | 4.3 | 1.1E−03 | 3.6E+20 |
| A33 | 3 | 1.5 | 5.1 | 1.2E−03 | 3.8E+20 |
| A34 | 3 | 2 | 4.6 | 1.4E−03 | 3.8E+20 |
| A35 | 3 | 2.5 | 4.5 | 1.6E−03 | 4.1E+20 |
| A36 | 3 | 3 | 4.5 | 1.6E−03 | 4.3E+20 |
| A37 | 3 | 3.5 | 4.2 | 2.0E−03 | 3.8E+20 |
| A38 | 3 | 4 | 4.1 | 2.5E−03 | 3.5E+20 |
| A39 | 3 | 4.5 | 3.9 | 3.3E−03 | 2.9E+20 |
| A40 | 3 | 6 | 3.5 | 6.9E−03 | 2.0E+20 |
| A41 | 3.5 | 1.5 | 4.6 | 1.6E−03 | 3.5E+20 |
| A42 | 4 | 0.5 | 3.9 | 1.6E−03 | 2.9E+20 |
| A43 | 4 | 1.5 | 3.4 | 1.9E−03 | 3.1E+20 |
| A44 | 4 | 1 | 3.9 | 1.8E−03 | 2.9E+20 |
| A45 | 4 | 2 | 4.0 | 2.1E−03 | 3.2E+20 |

TABLE 2-continued

| | Ti content (at. %) | Ga content (at. %) | Environmental durability test result (%) | Resistivity ($\Omega$cm) | Carrier density ($cm^{-3}$) |
|---|---|---|---|---|---|
| A46 | 5 | 0.5 | 3.9 | 2.9E−03 | 2.3E+20 |
| A47 | 5 | 1 | 3.9 | 3.2E−03 | 2.2E+20 |
| A48 | 6 | 1 | 4.2 | 9.0E−03 | 1.3E+20 |
| A49 | 6 | 2 | 3.5 | 1.3E−02 | 1.2E+20 |
| A50 | 6 | 3 | 3.4 | 2.0E−02 | 1.0E+20 |

What is claimed is:

1. A zinc-oxide-based sputtering target or a zinc-oxide-based ion-plating target, comprising zinc oxide as a predominant component, and both titanium (Ti) and gallium (Ga), wherein a titanium content x (at. %) and a gallium content y (at. %) satisfy the following conditions:

the titanium content (x) is 1.1 at. % or more, or the gallium content (y) is 4.5 at. % or more;

the gallium content (y) (at. %) is equal to or less than (−2.5x+9.8);

the gallium content (y) (at. %) is equal to or greater than (−0.5x+1.1), excepting the case where the titanium content (x) or the gallium content (y) is 0 (at. %); and the gallium content y (at. %) is equal to or less than (−x+3.4); or the gallium content (y) (at. %) is equal to or less than (x−0.9).

* * * * *